US007019402B2

(12) United States Patent
Andry et al.

(10) Patent No.: US 7,019,402 B2
(45) Date of Patent: Mar. 28, 2006

(54) SILICON CHIP CARRIER WITH THROUGH-VIAS USING LASER ASSISTED CHEMICAL VAPOR DEPOSITION OF CONDUCTOR

(75) Inventors: Paul Stephen Andry, Mohegan Lake, NY (US); Leena Paivikki Buchwalter, Hopewell Junction, NY (US); Russell Alan Budd, North Salem, NY (US); Thomas Anthony Wassick, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 10/686,640

(22) Filed: Oct. 17, 2003

(65) Prior Publication Data

US 2005/0082676 A1    Apr. 21, 2005

(51) Int. Cl.
*H01L 23/48* (2006.01)
(52) U.S. Cl. .................. 257/763; 438/672; 438/681; 438/628; 438/629; 438/630; 118/722; 257/762; 257/773
(58) Field of Classification Search ............. 438/672, 438/681, 628, 629, 630; 118/722; 257/762, 257/773
See application file for complete search history.

(56) References Cited

U.S. PATENT DOCUMENTS

| 5,060,595 A | * | 10/1991 | Ziv et al. .................. 118/722 |
| 6,429,524 B1 | * | 8/2002 | Cooney et al. ............. 257/762 |
| 6,686,278 B1 | * | 2/2004 | Wang et al. ................ 438/672 |

* cited by examiner

*Primary Examiner*—Mai-Huong Tran
(74) *Attorney, Agent, or Firm*—Connolly Bove Lodge & Hutz LPP; Daniel P. Morris

(57) ABSTRACT

This disclosure teaches a method of filling deep vias or capping deep conducting paste filled vias in silicon or glass substrate using laser assisted chemical vapor deposition of metals. This method uses a continuous wave or pulsed laser to heat the via bottom and the growing metal fill selectively by selecting the laser wavelength such that silicon and/or glass do not absorb the energy of the laser in any appreciable manner to cause deposition in the field. Alternatively holographic mask or an array of micro lenses may be used to focus the laser beams to the vias to fill them with metal. The substrate is moved in a controlled manner in the z-direction away from the laser at about the rate of deposition thus causing the laser heating to be focused on the surface region of the growing metal fill.

30 Claims, 7 Drawing Sheets

SILICON CHIP CARRIER WITH THROUGH-VIAS USING LASER ASSISTED CHEMICAL VAPOR DEPOSITION OF CONDUCTOR

FIELD OF THE INVENTION

The present invention relates generally to integrated circuits, and particularly, but not by way of limitation, to a semiconductor or glass substrate-based carrier for mounting and packaging multiple integrated circuit chips and/or other devices. The carrier is a freestanding chip or wafer with insulated, conductive through-vias exposed on top and underside, to connect flip-chip and other device I/O through the carrier to next-level package, board, or other flip-chips mounted on the bottom side. The present invention relates to filling a blind-via with a metal rod. Subsequent to forming a metal-filled, blind via, and subsequent to any optional frontside processing the invention contemplates the opening of the bottom of the via thereby forming a through-via. Opening a via from the backside is taught in U.S. Pat. No. 6,593,644 and in co-pending application Ser. No. 10/729,254. These references are assigned to the assignee of the present invention and their contents are hereby incorporated in their entirety and for all purposes. Briefly, the substrate is ground from the backside, polished, and finally the oxide lining on the now exposed via bottom is etched to expose the metal thus allowing conductivity from one side of the carrier to the other side through the thinned substrate.

BACKGROUND

This invention is directed to insulated, conductive through-vias formed in a self-supporting carrier substrate. The substrate must be thick enough to be self-supporting. Fabrication process practicalities place lower limits on via diameters. For realistic substrate thickness (e.g. 100–700 micrometers) and realistic via aspect ratios (e.g. 3:1 to 10:1), via diameters must range from about 10 micrometers to greater than 200 micrometers. Via fill methods common to integrated circuit interconnects become technically problematic or impractical when trying to fill such large blind holes (to be opened later). Ser. No. 10/729,254 and Ser. No. 10/700,327 overcome these practical issues by teaching a multitude of different techniques to fill vias with metal-ceramic pastes. However, paste-filled vias are associated with an undesirably high degree of porosity. Extensive processing is required to seal any via surface containing exposed porosity.

More specifically, this invention relates to filling and capping deep, high aspect ratio vias by methods that solve the problem of porosity. Since the vias can be hundreds of micrometers deep, it is important that the metal deposition rate be high. The only viable solid metal fill method currently available is laser assisted chemical vapor deposition (LCVD). Electroplating are metal-deposition processes that tend to be relatively free of the problems of voiding and porosity. Metals such as gold, silver, copper, and aluminum are commonly deposited by electroplating. However, no electroplating or electroless processes presently exist for W, Mo, or Ta. Plasma jet processes are available to deposit W, Mo, and Ta. Plasma jet processes are unsuitable for filling high aspect ratio vias because their high deposition rates, result in porous metal structures.

U.S. Pat. No. 4,938,996 teaches the use of laser assisted chemical vapor deposition of aluminum or refractory metals (e.g., tungsten) in vias. Discussion of this prior art and the present invention is below.

FIG. 1 is a description of the sample configuration required to practice prior art U.S. Pat. No. 4,938,996. FIG. 2 is a description of a sample configuration of the present invention. In chemical vapor deposition (CVD) a solid material is deposited from gaseous reactants by chemical reactions that occur on, or in the vicinity of, a surface heated to a critical temperature. In laser assisted CVD (LCVD) a laser is used as a localized heat source to heat the surface on which it is desired to deposit the solid material.

FIG. 1 shows a silicon substrate (100) is covered with a thin layer of $SiO_2$ (110). The layer of $SiO_2$ (110) covers the field of the substrate where deposition of metal is not desired. The $SiO_2$ layer (110) functions to keep the field surface at a temperature below a critical temperature so as not to cause deposition of metal during laser heating of the Si substrate covered by layer (110). The thickness of $SiO_2$ layer (110) is determined by the required metal feature height. Via (160) is made in $SiO_2$ (110) and opens to a conductive layer (150), either doped Si or metal, previously deposited on the substrate (100).

The prior art laser radiates at frequencies that do not couple with $SiO_2$. The laser must not couple with the $SiO_2$ in order that the insulator not be heated in excess of a threshold temperature. Temperatures above a threshold, or critical, temperature causes metal deposition. Such heating of the $SiO_2$ would lead to metal deposition at undesired locations. The prior art laser must further be a pulsed laser to avoid excessive conductive heating of the $SiO_2$ coating on the surface.

The prior art laser couples with, and thereby heats, silicon (100) and the via metal (150). Because the laser must couple with the substrate in order to deposit metal thereon, the substrate is limited to materials such as Si.

In CVD processes, metal is deposited from a precursor gas. For tungsten, the most commercially viable precursor gas is $WF_6$. Tungsten is deposited by reaction with a reducing gas, such as $H_2$, as indicated in Scheme 1:

Scheme 1

$$WF_6\,(g) + 3H_2\,(g) \longrightarrow W\,(s) + 6HF\,(g)$$

The reaction product, gaseous HF, rapidly etches $SiO_2$. Therefore, prior art processes do not permit tungsten to be deposited directly on $SiO_2$, but are limited to deposition on Si or metal. An additional drawback of prior art processes is that $SiO_2$ thicknesses and via dimensions are altered due to HF etching.

The prior art relates to small diameter, e.g. 0.5 µm, low aspect ratio, e.g. 1 to 2 µm, vias.

SUMMARY OF INVENTION

An aspect of the present invention provides a high aspect ratio, solid-metal filled via, comprising: a semiconductor substrate having a high aspect ratio via defined therein, said via having a bottom and at least one sidewall; a layer of an electrical insulator lining said via bottom and said at least one sidewall, wherein said insulator electrically isolates said via from said substrate; a layer of an adhesion promoter lining said insulator; a layer of a seed material lining said adhesion promoter; and a solid metal rod filling said via.

An aspect of the present invention provides that the inventive via is electrically isolated from the substrate by provision of a layer of a dielectric material interposed between the metal rod and the substrate.

An aspect of the present invention provides a high aspect ratio via having a depth of from about 100 to 300 micrometers and an aspect ratio of from about 3:1 to about 10:1.

An aspect of the present invention provides a seed layer and/or an adhesion promoter layer lining an insulator. Laser frequencies are chosen that couple with the seed layer and/or the promoter layer. Because the laser couples with the liner, the substrate is not limited to a material that couples with the laser. Therefore glasses, such as quartz are suitable substrates for the present invention.

An aspect of the present invention provides solid-metal rod filler is selected from the metals that are suitably deposited by LCVD. Such metals include tungsten, molybdenum, tantalum, and platinum.

An aspect of the present invention provides a via wherein the metal rod filler and associated seed, adhesion, and dielectric layers are planarized to be co-planar with a major surface of the substrate.

An aspect of the present invention provides a method of fabricating a high aspect ratio, solid-metal rod filled via comprising: providing a semiconductor substrate; defining a high aspect ratio via in said substrate, wherein said via has a bottom and at least one sidewall; lining said via bottom and said at least one sidewall with a layer of a dielectric, wherein said dielectric electrically isolates said via from said substrate; lining the insulator with a layer of an adhesion promoter; lining the adhesion promoter with a layer of a seed material; and filling the via with a solid metal rod.

An aspect of the present invention provides a method of fabricating a high aspect ratio, solid-metal rod filled via, wherein the solid metal rod is formed by a thermally-activated chemical vapor deposition (CVD) process.

An aspect of the present invention provides a method of fabricating a high aspect ratio, solid-metal rod filled via, wherein the thermally-activated chemical vapor deposition (CVD) process is a laser assisted CVD (LCVD) process.

An aspect of the present invention removes the pulsed laser limitation of the prior art and provides the laser may be a continuous wave (CW) or a pulsed laser.

An aspect of the present invention provides a method of fabricating a high aspect ratio, solid-metal rod filled via, wherein LCVD further comprises: providing an ambient comprising at least one precursor gas and at least one reducing gas; forming a nucleation site for a growth of metal by focusing a laser on a coupling material (the seedlayer and/or the adhesion promoter layer) on the bottom of a via; and depositing metal, from the precursor gas, at nucleation site, wherein the metal is deposited at an ascertainable rate of growth.

An aspect of the present invention provides a method of fabricating a high aspect ratio, solid-metal rod filled via, wherein LCVD further comprises: mounting the substrate on a three-axis mount; and propagating the growth of a metal rod by moving said mount away from the laser focus at a rate substantially equal to the growth rate.

An aspect of the present invention provides a method of fabricating a high aspect ratio, solid-metal rod filled via, wherein non-limiting examples of a suitable precursor gas are $WF_6$, $WCl_6$, $W(CO)_6$, $MoF_6$, $MoCl_6$, and $Mo(CO)_6$.

An aspect of the present invention provides a method of fabricating a high aspect ratio, solid-metal rod filled via, wherein non-limiting examples of a suitable reducing gas are hydrogen and silane.

An aspect of the present invention provides that laser radiation is focused on the growing rod surface by a lens.

A further aspect of the present invention provides an array of vias and a corresponding array of lenses such that laser radiation is focused on a growing surface of a metal rod in each of said vias.

An aspect of the present invention provides a method of fabricating a high aspect ratio, solid-metal filled via, comprising: providing an array of vias; providing a mask having an array of voids, corresponding to the array of vias, defined therethrough, wherein said mask does not couple to said laser; irradiating said array of vias through said mask; and forming a metal rod in each of said vias.

A further aspect of the present invention provides a method of fabricating an array of high aspect ratio, solid metal rod filled vias comprising: providing a substrate containing an array of vias; mounting the substrate on a three-axis mount; providing a reaction chamber to contain the mount, the array of vias, and an ambient of at least one precursor gas and at least one reducing gas; providing a mask having an array of voids corresponding to the via array defined therethrough, wherein said mask is positioned outside said chamber; irradiating said array of vias through mask; and forming a metal rod in each of said vias.

A still further aspect of the present invention provides a method of fabricating an array of high aspect ratio, solid metal rod filled vias comprising: providing an array of vias; providing a high pulse rate, laser microvia drill; irradiating said array of vias using said microvia drill; and forming a metal rod in each of said vias.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

Figure 1:
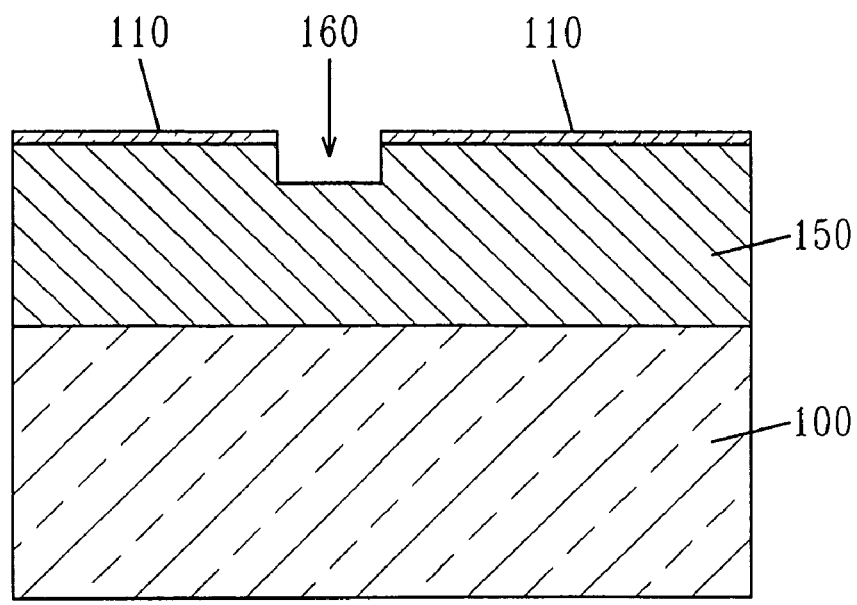
FIG. 1 shows a small-dimensioned via of the Prior Art.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures.

This invention is directed to insulated, conductive through-vias formed in a self-supporting carrier substrate. The requirement that the substrate be self-supporting implies a thickness of from about 100 to 700 micrometers. The inventive vias are initially formed as blind-vias. However, it is intended that they be opened to form through-vias. For purposes of the present invention, via cavities may be formed by any of a variety of methods known to the art.

Fabrication process practicalities place lower limits on via diameters. Given realistic substrate thicknesses of up to 700 micrometers and realistic via aspect ratios (e.g. 3:1 to 10:1), via diameters must range from about 10 micrometers to greater than 200 micrometers. Via fill methods common to integrated circuit interconnects become technically problematic or impractical when trying to fill such large blind holes. Co-pending applications IBM Ser. Nos. 10/729,254 and 10/700,327 overcome these practical issues by teaching a multitude of different techniques to fill vias with metal-ceramic pastes.

Paste-filled vias may be undesirable for a variety of reasons. Table I shows that copper pastes have a much higher electrical resistance, and therefore lower conductivity, than do solid metals. Moreover, paste-filled vias are associated with an undesirably high degree of porosity. Extensive processing is required to seal any via surface containing exposed porosity.

TABLE 1

Material properties of selected metals and CSVP copper paste

| Material | E (GPa) | ΔE/ΔT MPa/C. | $\sigma_y$ (MPa) | CTE (ppm/C) | Electrical Resistivity μΩcm | Thermal Conductivity W/mK | Poisson ratio |
|---|---|---|---|---|---|---|---|
| CSVP Cu | | | | 8 | 20–25 | | |
| Cu | 110 | −39 | 320 | 16.5 | 1.73 | 380 | 0.35 |
| Au | 79 | −19 | 210 | 14.2 | 3 | 317 | 0.35 |
| Al | 72 | −31 | 110 | 23.1 | 4 | 237 | 0.345 |
| W | 411 | −42 | 1800 | 4.5 | 5.39 | 180 | 0.28 |
| Mo | 300 | −43 | 840 | 4.8 | 5.7 | 140 | 0.321 |
| Pt | 168 | −23 | 160 | 8.8 | 10.6 | 72 | 0.38 |
| Ta | 186 | −25 | 350 | 6.3 | 13.4 | 54 | 0.34 |

In view of the problems associated with metal paste via fill, this invention relates to filling and capping deep, high aspect ratio vias by methods that eliminate the high resistivity and porosity associated with conductive paste fill. The present invention provides means of fabricating a solid metal rod in a blind-via. Because vias can be hundreds of micrometers deep, it is important that metal deposition rates be high. The only viable solid metal fill method currently available is laser assisted chemical vapor deposition (LCVD). Electroplating are metal-deposition processes that tend to be relatively free of the problems of voiding and porosity. Metals such as gold, silver, copper, and aluminum are commonly deposited by electroplating. However, electroplating processes do not presently exist for W, Mo, or Ta. Plasma jet processes are available to deposit W, Mo, and Ta. Plasma jet processes are unsuitable for filling high aspect ratio vias because their high deposition rates, result in porous metal structures.

Figure 2:
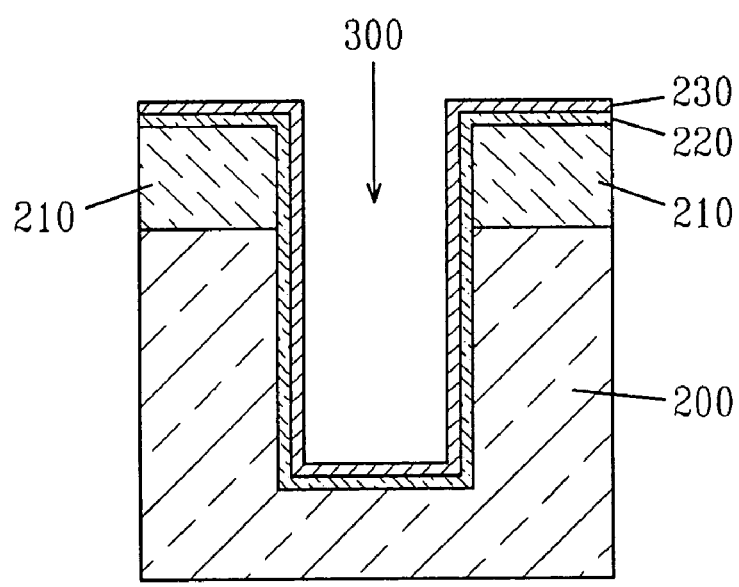
FIG. 2 shows an electrically isolated, large-dimensioned, high aspect ratio, blind via of the present invention. Via (300) is made in silicon substrate (200). The surfaces of via (300) and substrate (200) are covered with a relatively thick silicon dioxide layer (210), a TiN adhesion layer (220), and a W seed layer (230).

The present invention provides a carrier (known herein as the substrate) having at least one chip mounted on a top surface; the carrier itself, is mounted on a ceramic module. The invention further provides a means of electrically connecting the chip, mounted on the carrier top surface, to the ceramic module mounted below the carrier. The electrical connection means is provided in the form of a through-via formed in the carrier. The through-via is filled with a conductive metal rod that comprises the actual electrical connection. To prevent the metal rod from shorting to the carrier, the vial wall(s) is/are lined with a dielectric material FIG. 2 shows a schematic of an unfilled via of the present invention. A deep blind-via (300) is formed in a silicon carrier substrate (200). Via (300) is from about 200 to about 400 micrometers deep with an aspect ratio of from about 3:1 to 10:1. Electrical isolation is accomplished by lining via (300) with a dielectric (210) to insulate it from the silicon to avoid electrical connection with other devices in the same silicon substrate. Suitable, but non-limiting dielectric materials (210) include silicon nitride (SiN), silicon oxynitride (SiO$_x$N$_y$), and silicon oxide (SiO$_2$). The dielectric layer, also termed the insulator layer, is typically from about 50 to 5000 nanometers thick. In an embodiment, the dielectric liner comprises a stack of a layer of SiO$_2$ overlaid with a layer of SiN. In an embodiment, the SiN layer in the dielectric stack is from about 50 to about 100 nanometers thick.

The LCVD methods of the prior art required the laser radiation to couple with, and heat, the substrate in order thereby to deposit metal on the substrate. The coupling requirement limited available substrates to silicon and metals deposited on silicon. The present invention couples the laser radiation to a material lining the via cavity thereby removing limitations on the substrate material. Suitable, but non-limiting, materials for substrate (200) include silicon, quartz, glass, and high temperature polymer. A suitable high temperature polymer is polyimide, a suitable polyimide is Kapton® (Trademark of DuPont).

As defined herein, coupling of laser radiation with a material means that the light output from the laser interacts with said material in such a manner so as to cause the temperature of that material to rise to a critical temperature. The critical temperature is that temperature at which, given the other environmental parameters, metal, such as tungsten or molybdenum is deposited from a reactant gas. Generally, the critical temperature is approximately 1100° K. Generally, coupling is defined as causing a temperature of a laser-irradiated material to rise to 1100° K.

For purposes of the present invention, it is not possible to practice the prior art because heating would have to happen through and including the oxide in order to deposit metal. Heating the dielectric oxide would cause metal to be deposited everywhere on the substrate. Filling a 200 to 400 micrometer deep via hole would result in a similar sized layer of unwanted metal. Overburden removal using chemical mechanical polishing (CMP) or other such technique known in interconnect technology would be prohibitive.

It is well known that W adhesion to $SiO_2$ is poor, thus prior art structures are prone to adhesion related failures. To avoid these problems and to allow tungsten to be deposited from the preferred gas phase chemistry, dielectric liner (210) is further lined with an adhesion promoter (220), which may be TiN, TaN, or any other material that improves W adhesion to the dielectric which is preferably $SiO_2$. The adhesion promoter layer is alternatively known as an adhesion layer. The adhesion layer is typically from about 10 nanometers to about 500 nanometers thick.

Where the insulator is in the form of a stack (outside-to-inside) $SiN/SiO_2$, the adhesion layer to improve W adhesion may be Ta, Cr, Ti, TaN, or TiN, or any other metal that reduces SiN. The melting point of the adhesion layer metal, and the decomposition temperature of the metal nitride, must be above the temperature reached during LCVD processing, or >1100 K. Preferably, the melting/decomposition temperature is a few hundred degrees K above the 1100° K LCVD temperature. Adhesion layer (220) is further coated with a seed layer (230). Seed layer (230) may be a thin layer of tungsten or molybdenum. Other metals may serve as a seed for W provided that their melting point is somewhat above the LCVD induced temperature, i.e. >1100 K+few hundred degrees for safety margin and provided they are resistant to HF attack. Typically, the seed is applied as a 10 to 500 nanometer thick layer is applied in situ using methods known in interconnect technology to protect the metal rod (W, Mo, or other) to adhesion promoter interface and thus assuring stronger interface. Bjorklund teaches that at certain $H_2/WF_6$ ratios W will not etch thus the W/TiN (for example) will be a reliable protection against HF attack.

The various layers, including the dielectric layer, the adhesion layer, and the seed layer, are collectively known as a stack. A stack may comprise some, but not all, of the layers. Alternatively, the stack may comprise each of the layers.

A blind-via of the present invention is formed open to a major surface of the substrate. In an embodiment of the present invention, a stack is formed on the via bottom and the via sidewall or walls. The stack is formed such that the various layers formed on the sidewall(s) are continuous with the corresponding layer formed on the via bottom. In an embodiment, a stack is formed on the major surface of the substrate to which the via opens. When a stack is formed on a major surface, the various layers lining the surface are continuous with the corresponding layer on the via sidewall (s).

An embodiment of the present invention provides a solid metal rod filling the cavity of a blind via. The metal rod is any metal that can be deposited by means of laser assisted chemical vapor deposition (LCVD). Preferably, the metal is any of tungsten, molybdenum, tantalum, and platinum. Most preferably, the metal is tungsten.

In chemical vapor deposition (CVD) a solid material is deposited from gaseous reactants by chemical reactions on, or in the vicinity of, a heated surface. (See Björklund, K., Microfabrication of Tungsten, Molybdenum, and Tungsten Carbide Rods by Laser-Assisted CVD. Acta Universitatus Upsaliensis. *Comprehensive Summaries of Uppsala Dissertations from the Faculty of Sciences and Technology* 679. 2001, and references therein). The resulting properties of the deposited material can be controlled by appropriate regulation of the process conditions. Deposition is a multi-step process, including: 1) transport of precursors to the vicinity of the substrate surface; 2) transport of precursors to the substrate surface; 3) adsorption of precursors on the substrate surface; 4) diffusion of precursors on the substrate surface; 5) surface chemical reactions; 6) nucleation; 7) desorption of gaseous reaction products; and 8) transport of the gaseous reaction products away from the reaction zone.

In LCVD a laser is used to thermally or photochemically activate the CVD process. Laser frequencies are chosen such that the gaseous reactants do not absorb the radiation. A focused laser acts as a localized heat source; the wavelength chosen should not excite, or couple with, the gas phase. A preferred wavelength is Ar+ at 514.5 nanometers. Dielectrics, such as $SiO_2$, are transparent to this wavelength, but silicon and metals exhibit strong coupling. Thermalization of the laser energy is fast compared to the reactions in steps 1–8. An embodiment of the present invention provides a continuous wave laser. In an alternative embodiment, a pulsed laser is used.

The LCVD process described by K. Bjorklund is a thermally activated CVD process. Thus it is important to get the temperature locally high enough to cause metal deposition. Continuous-wave (CW) focused laser beam for adequate heat generation (up to 1100 K) is required. The metal deposition occurs at the focal point of the laser. Controlled z-axis movement of the sample may confer a benefit by providing a means to control the temperature of the substrate. Such temperature control may be particularly beneficial where the substrate is organic, i.e. a high-temperature polymer.

The present invention embodies thermally activated LCVD using a configuration wherein the laser beam is incident to the treated surface substantially perpendicularly. The various reaction steps, 1–8 above, occur only within the laser-heated zone. Thermal LCVD confers high growth rates and a small size of the deposition area. High growth rates are due to the effective, nearly three-dimensional mass transport of the gaseous species to the deposition zone. Since laser beams can be focused, small areas can be heated and a typical laser beam in the visible region can be focused down to a spot size below 1 micrometer in diameter.

CVD techniques may be used to deposit various solid materials such as metals and non-metals and compounds such as carbides, nitrides and oxides. Deposition may occur in the form of thin films, powders, fibres, rods, and other three-dimensional structures.

Solid materials are deposited from a precursor gas. The precursor can be a solid, liquid, or a gas at room temperature.

However, a solid or liquid precursor must be evaporated or sublimated before it is introduced into the reaction zone. An appropriate precursor must have a high vapor pressure, be stable at room temperature, and have a high purity. It is also highly desirable that the precursor and its resulting gaseous products be relatively non-toxic. Toxic precursors and/or reaction products will make the handling and cleaning processes much more difficult and expensive.

For the deposition of metallic tungsten and molybdenum, the predominant precursors have been various metal halides and organometallic compounds. For tungsten deposition, preferred, but not limiting, precursors include $WF_6$, $WCl_6$ and $W(CO)_6$. A most preferred precursor for tungsten is tungsten hexafluoride that has a high vapor pressure (880 Torr at 21° C.), a relatively low price and a low contamination level of the resulting deposits. For molybdenum deposition, preferred, but not limiting, precursors include $MoF_6$, $MoCl_6$ and $Mo(CO)_6$. The hexafluoride is a most preferred precursor for molybdenum.

Formation of a metallic deposit requires the reduction of a precursor compound. Reduction occurs through the agency of a reducing gas. Preferred reducing gasses include hydrogen and silane. A most preferred reducing gas is hydrogen. The reactant gas composition of the preferred components, $WF_6$ and $H_2$ is selected such that the ratio of $H_2/WF_6$ is high. The ratio is equivalently expressed as a molar ratio or a ratio of partial pressures. When the $p_{H2}/P_{WF6}$ ratio is low, about 3, the rate at which solid tungsten is deposited from the hexafluoride is comparable to the rate at which solid tungsten is etched, i.e., converted to the pentafluoride.

Scheme 2

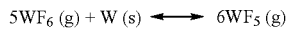

$5WF_6 (g) + W (s) \leftrightarrow 6WF_5 (g)$

Because of the competing processes, the net rate of tungsten deposition is low at low $H_2/WF_6$ molar ratios. At high ratios (~5), the rate of W etching is low, thereby yielding a high net rate of deposition.

An embodiment of the present invention provides that the gasses contact the substrate and vias while contained within a reaction chamber. The chamber is fitted with a window to admit laser light. the window is transparent or substantially transparent to the operating frequency of the laser. The chamber is also fitted with an input port and supply for the precursor and reducing gasses. The chamber is fitted with a vent port to exhaust the reaction product gasses.

Filling a large-dimensioned via with a solid-metal rod presents additional problems not encountered by the prior art. Thermal excursions caused by power on-off cycling may induce large thermal expansion mismatches between fully metal-filled vias and the carrier substrate. Such mismatches may be reduced by appropriate choice of the via metal. Table 1 lists relevant properties for alternative materials compared with copper paste and solid copper. The electrical properties of alternative via metals must be comparable to, or better than those for copper paste. Thermal stresses created in the via by thermal cycling must be lower than that induced by solid copper to avoid via bulging and/or substrate fracture that may be experienced with fine pitched, copper-filled deep vias. Such stresses are described in co-pending IBM docket Ser. No. 10/729,254. These considerations limit alternative materials to those shown in Table 1. The small-dimensioned vias of the prior art (U.S. Pat. No. 4,938,996), do not experience similar magnitudes of thermal stress caused problems as do the large volume-vias of the present invention used in carrier applications.

Table 2 compares the thermal stress created in vias filled with Cu, W, Mo, or Ta. In comparison to Cu the alternative materials exhibit significantly lower thermal stresses. FIG. 1 shows that the displacement of the solid tungsten via is only about 15% that of a solid copper via.

TABLE 2

Estimation of thermal stresses created in a closed via

| Material | $\sigma_{TH} = \Delta T*CTE*E/(1-2v)$ Compression (GPa) |
|---|---|
| Cu | 2.3 |
| Pt | 2.3 |
| Al | 2.0 |
| W | 1.6 |
| Mo | 1.5 |
| Ta | 1.4 |
| Au | 1.4 |

Bjorklund teaches LCVD deposition of single crystal and polycrystalline tungsten rods. By these methods, deposition rates of up to 5.3 micrometers/s may be achieved. To fill a 200 micrometer deep via by these methods would require about 40s per via. To increase process through-put, an array of vias must be filled simultaneously. Preferably, all the vias on a whole chip site, or more preferably, all the vias on an entire wafer, would be processed simultaneously.

Figure 4A:
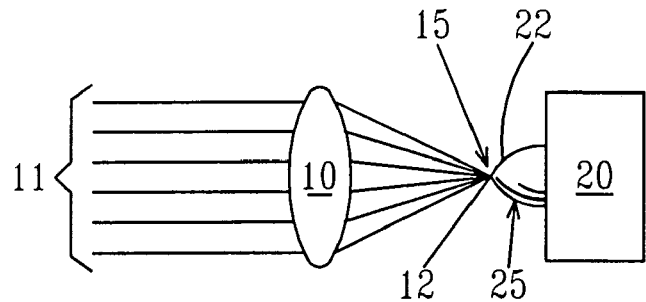
FIG. 4 is a schematic of solid single crystal or polycrystalline metal rod deposition using LCVD. The substrate (20) is moved away from the laser (11) focal point so that the metal (15) surface is at focus causing further deposition of metal at the hot region.
Figure 4B:
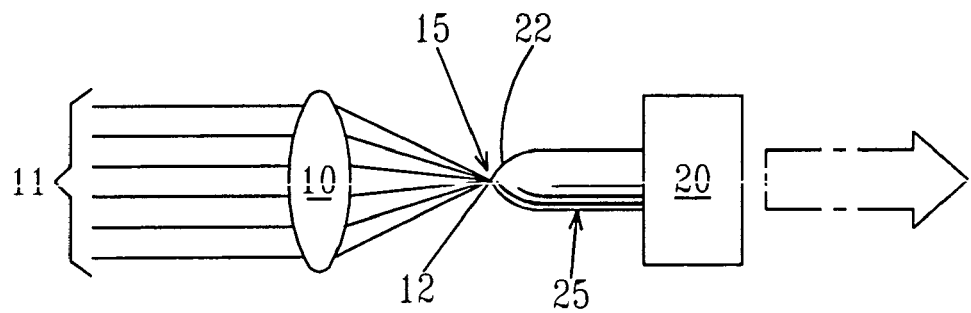
Figure 4C:
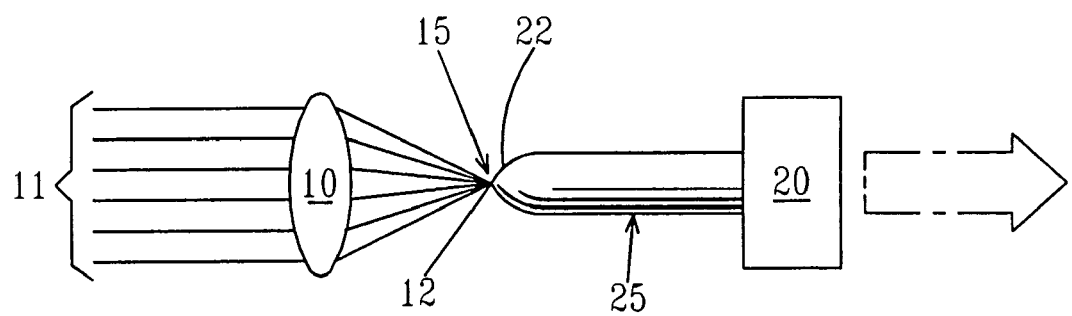
Figure 5A:
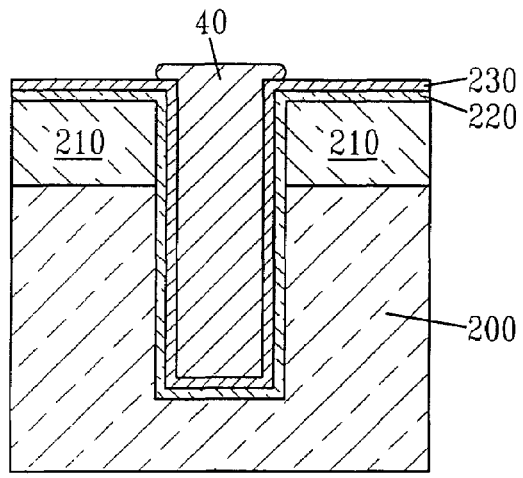
FIG. 5 shows a metal (40) filled via in a silicon substrate (200) lined with silicon dioxide (210), TiN (220), and W (230). Figure also shows the structure after W chemical mechanical polishing to planarize the metal filled via surface with the field region around it.
Figure 5B:
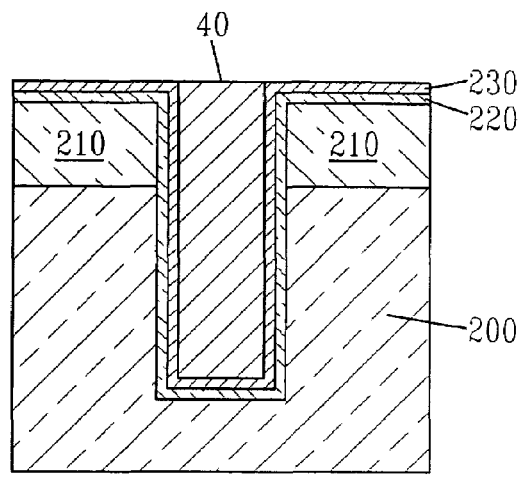

In an embodiment of the present invention, a tungsten rod (also termed a column) is grown without a mask as described by Bjorklund and Zhou. FIG. 4 shows a laser beam (11) focused through a lens (10) to the growing metal rod surface region (15) on substrate (20). Substrate (20) is placed on a mount (not shown). The mount is capable of controlled motion in at least the z-direction (parallel to the laser beam). Preferably, the mount is capable of controlled motion in each of the x-, y-, and z-directions. Substrate (20) is a material that couples with the laser radiation. Alternatively the substrate is coated with a layer of a material, such as a seed layer or a metal, that couples with the laser light. FIG. 4A shows a nucleation site (15) formed where the laser focus (12) is incident on the substrate or coupling layer. FIGS. 4B and C depict the growth of rod (25) from nucleation site (15). After formation of nucleation site (15), the mount, and the attached substrate, is translated in the z-direction. The rate of translation is such that laser focus (12) remains incident on the surface (22) of the growing rod (25). In order that the laser focus (12) remain incident on the surface (22), the rate of translation must be substantially equal to the rate of growth.

Figure 7:
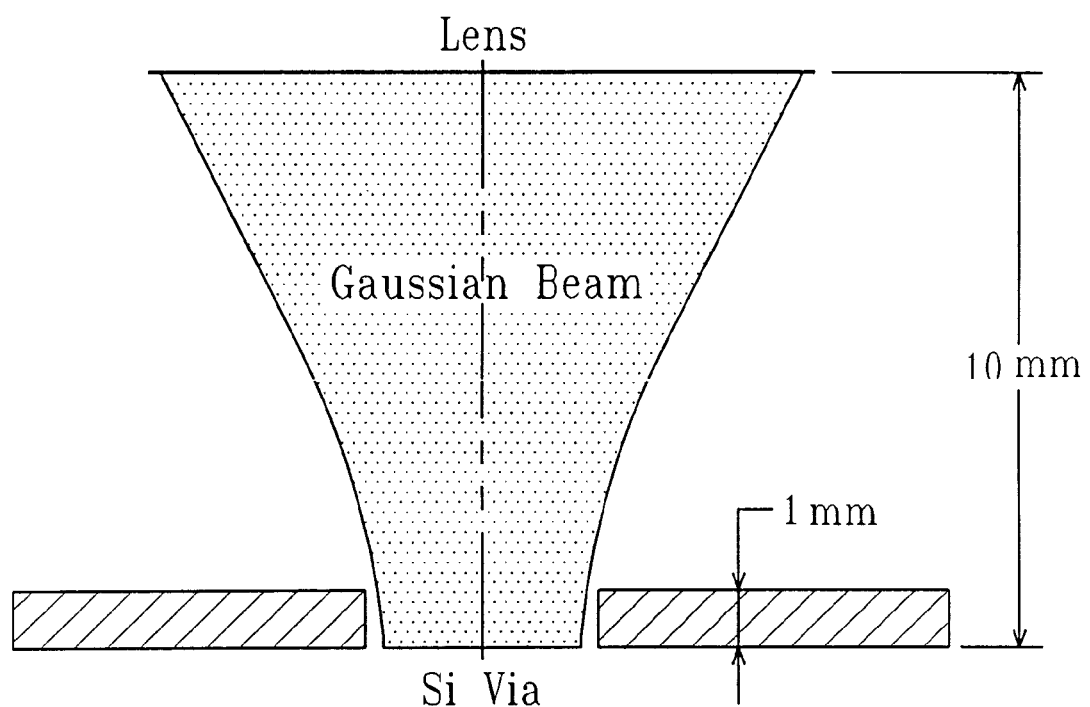
FIG. 7 shows focusing of laser beam into a deep via.

An embodiment of the present invention provides simultaneous filling of a multitude of deep blind-vias. An array of vias are drilled or otherwise formed in a substrate. Laser exposure of the vias is done through a mask as shown schematically in FIG. 7, where the laser beam (12) is masked (50) and focused on the growing metal surface region (40) in via in substrate (20), which is moved away from the laser focus in a controlled manner at about the growth-rate of the metal fill. A mask is provided having an array of voids formed therethrough corresponding to the via array. The mask is positioned in the reaction chamber such that the mask array is properly in registration with the via array. The materials forming the mask are chosen such that they do not couple with the laser light. In the absence of coupling, elevated temperatures do not occur on the mask and therefore, metal will not deposit on the mask.

An embodiment of the present invention provides the mask is positioned outside the reaction chamber. Positioning the mask outside the reaction chamber isolates the mask from the precursor and reducing gasses. Therefore, even should the mask couple with the laser, metal will not deposit on the mask. This embodiment confers the advantage of allowing the mask to be constructed of a wider range of materials, including materials that couple with the laser.

The mask may be a holographic phase mask, which can utilize up to 80% of the available laser energy (Litel Instruments, Inc) and may be positioned external to the reaction chamber outside of a laser transparent window.

An embodiment of the present invention provides an array of micro-lenses, corresponding to the via array, to focus the laser beam into a the array of deep vias to allow shorter wafer processing times. The incident power requirement for W deposition from $WF_6$ and $H_2$ is in the 100 mW–300 mW regime when using a CW $Ar^+$ laser.

In an embodiment, the $SiO_2$ (210) lined via (300) in FIG. 4 is further lined for example with TiN (220) (to increase W adhesion), and a thin W layer (230) to initiate the thermally activated LCVD process. The deep via must be completely lined with $SiO_2$ (210) to avoid shorting with the Si-substrate (200) and the other devices built in the silicon carrier.

In an embodiment the micro lenses may be located outside the reaction chamber. Because the laser focus can exceed the via depth, it is not necessary to move the substrate away from the focus in order to cause a growing of the metal rod. In such an embodiment, it is important to focus the laser beam to the bottom of the deep via without heating the via sidewalls. The depth of focus of a Gaussian beam confined to a via may be determined by knowing the wavelength of the laser beam and the spot size at the minimum focus, and follows the Gaussian beam equation:

$$w^2(z) = w_0^2 \left[1 + \left(\frac{\lambda z}{\pi w_0^2}\right)^2\right].$$ Eqn. 1

Figure 6:
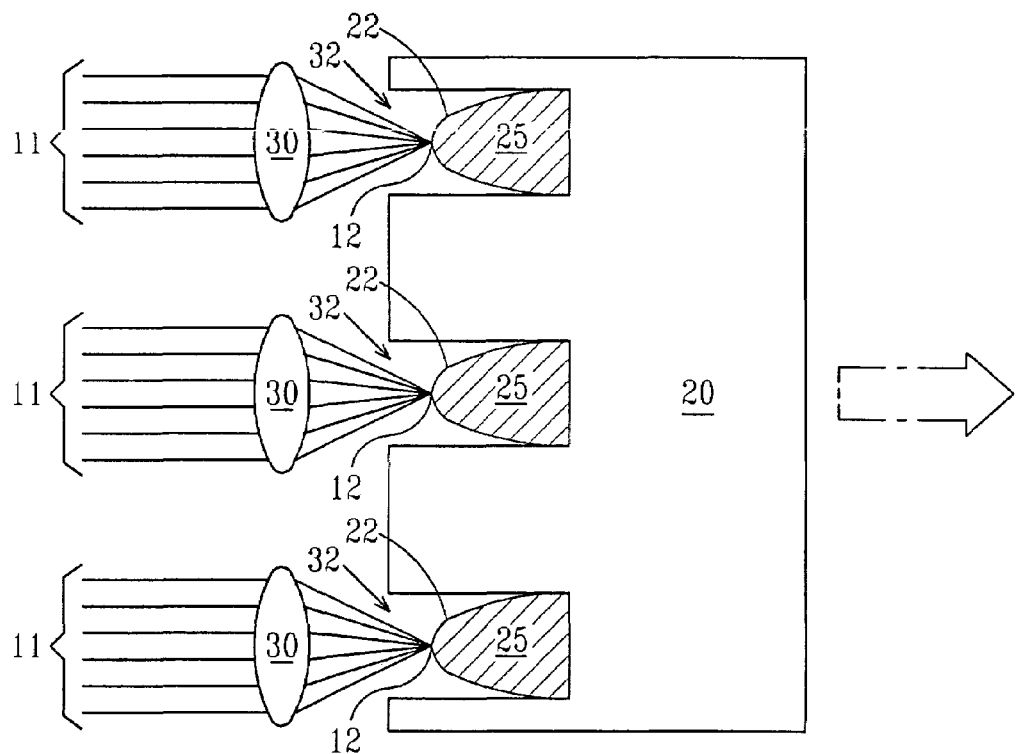
FIG. 6 shows shows micro lense (30) focused laser light (11) caused growth of metal (40) in vias in substrate (20).

Where: the spot size (w) is the radius at which the beam irradiance is $1/e^2$ of its axial value. The waist spot size ($w_0$) is the minimum spot size of the beam. The waist distance (z) is the distance from the observation plane to the beam waist. Given a wavelength of 514.5 nm, and a 45.0 micron diameter Gaussian beam (at the $1/e^2$ intensity) at the bottom of a via, the Gaussian beam diameter grown to just 47.3 microns diameter at the top of a 1 mm deep via. FIG. 6 describes the above. It is not necessary to have the focal diameter of the laser beam the size of the via diameter. The thermal conduction properties of the W seed will allow metal growth anywhere the temperature exceeds a critical temperature, which may be up to 1100 K.

In another embodiment, W is deposited from $W(CO)_6$. In this embodiment, the wafer may be silica coated silicon, or quartz. With this reactant no HF is formed, and thus it is possible to have $SiO_2$ exposed without the concern for its etching.

Figure 8:
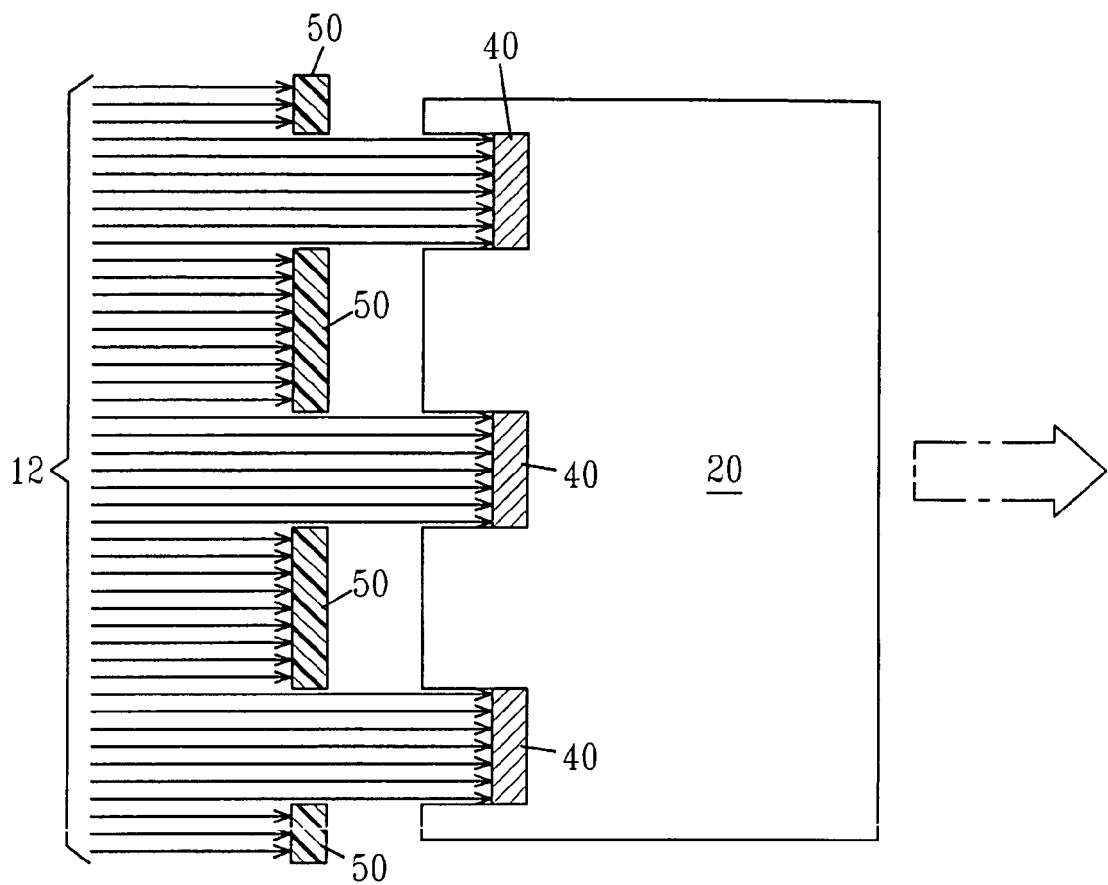
FIG. 8 shows laser light (12) masked with a mask (50) to the substrate at the via metal fill to cause metal fill thickness growth as the substrate (20) is moved away from laser focus at about the growth rate of the metal (40)
Figure 9:
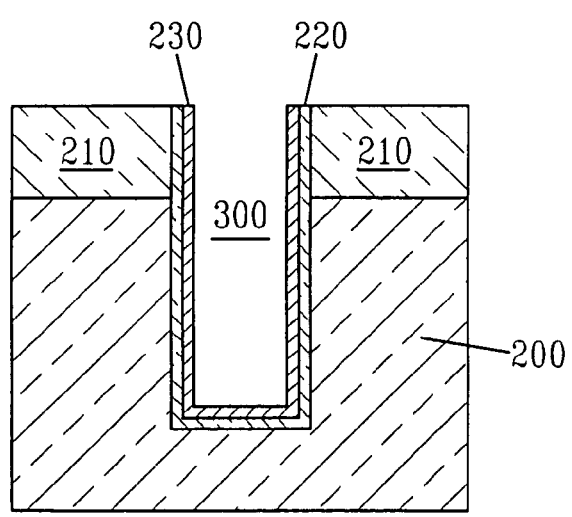
FIG. 9 shows a via (300) in a silicon substrate (200) lined with thick SiO$_2$ (210), thin TiN (220), and thin W (230). The W/TiN stack is removed from the top surface of the silicon carrier using CMP.

Working with a laser wavelength, at which wavelength W absorbs well while $SiO_2$ is transparent and Si absorption is weak. In this embodiment then the W (230)/TiN (220) is also deposited, but the field deposition is removed using chemical mechanical polishing prior to deep via fill, as shown in FIG. 8. No masking is necessary because the temperature of the $SiO_2$/Si stack in the field areas will not be high enough to cause metal deposition.

Yet in another embodiment the laser light is from an ESI tool with very fast repetition rate for single via at a time fill without the need for masking.

Figure 10A:
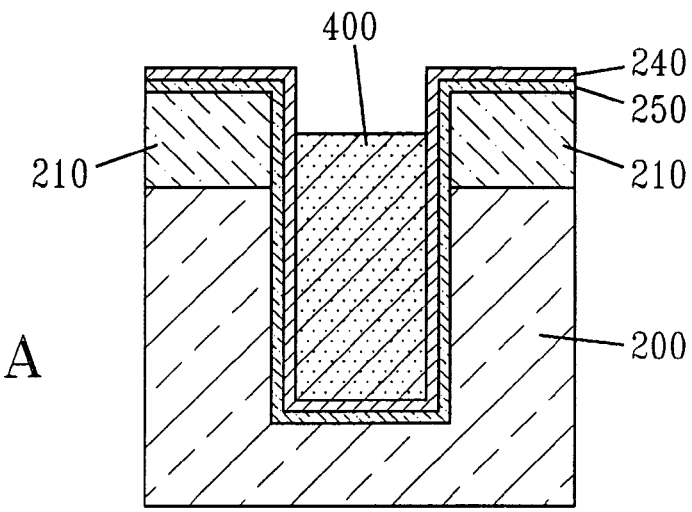
FIG. 10A shows a deep via lined with SiO$_2$ (210) and Ta/TaN liner (250) and Copper seed (240) and filled with copper-ceramic or another paste (400) in silicon substrate (200).
Figure 10B:
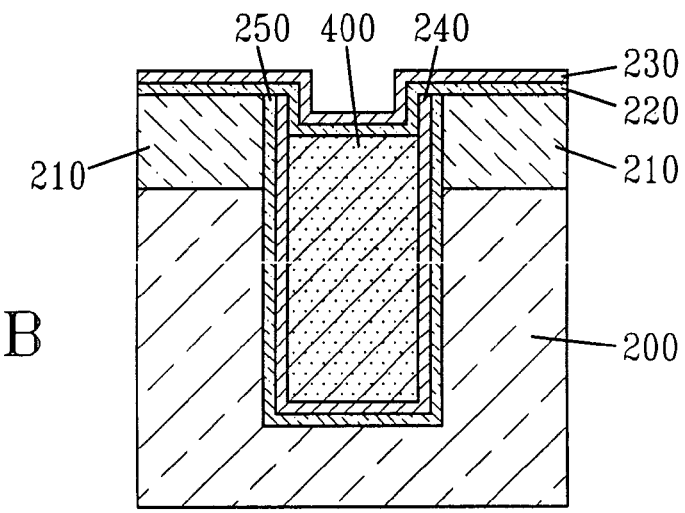
FIG. 10B shows the field Cu-seed liner stack removed with CMP and TiN (220) and W (230) covering the exposed surface.
Figure 10C:
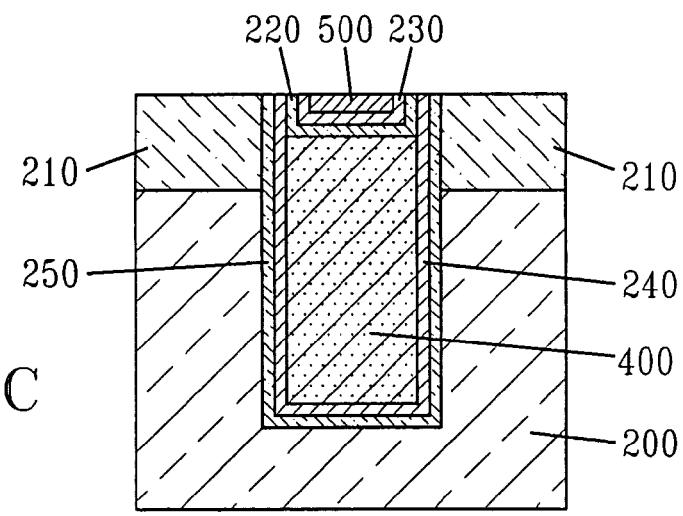
FIG. 10C shows the paste via capped with LCVD W (500), which is planarized using CMP. The excess W/TiN in the field is removed with CMP resulting in the structure shown in FIG. 10C.

Yet in another embodiment LCVD process is used to close open porosity for paste (copper-ceramic or another conducting paste) filled vias as shown in FIG. 10A–C. FIG. 10A shows the paste filled (400) and fired via in silicon substrate (200). The field copper seed (240) and liner (250) are removed using CMP. A new TiN liner (220) is deposited followed by W layer (230), as shown in FIG. 10B. The shallow via is then filled with LCVD W (500) thus capping all possible exposed porosity in the paste via (400). For simplicity of drawing the interfaces and layers with and on the paste a drawn linear. In reality the paste surface is rough with significant porosity, which is thus capped.

Figure 3:
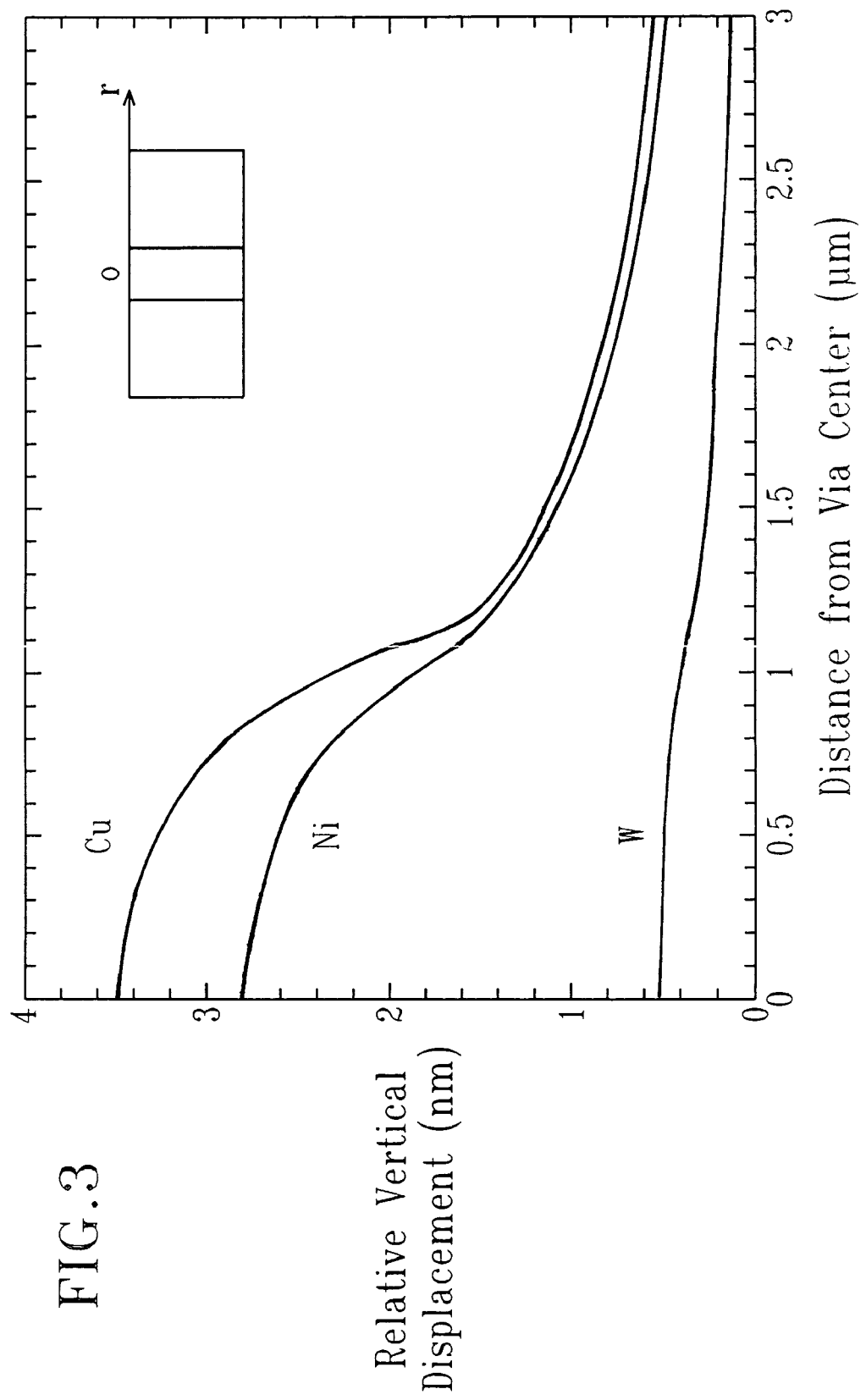
FIG. 3 shows the thermal-induced vertical displacement of via metal.

After the filling of the via the top is planarized with the surface of the substrate using chemical mechanical polishing (CMP) as shown in FIG. 3. CMP process exists for W. Instead of W one may use Mo, Ta, which all fit the requirements of the capping characteristics.

INCORPORATION BY REFERENCE

All publications, patents, and patent applications cited in this specification are herein incorporated by reference, and for any and all purposes, as if each individual publication, patent, or patent application were specifically and individually indicated to be incorporated by reference. In the case of inconsistencies the present disclosure will prevail. In particular, each patent and/or application assigned to the assignee of the present invention is herein incorporated by reference, and for any and all purposes.

Having thus described our invention, what we claim as new, and desire to secure by Letters Patent is:

1. A method of fabricating a high aspect ratio, solid-metal filled via comprising;
   providing a semiconductor substrate;
   defining a high aspect ratio via in said substrate, wherein said via has a bottom and at least one sidewall;
   lining said via bottom and said at least one sidewall with a layer of an electrical insulator,
   wherein said insulator electrically isolates said via from said substrate;
   lining said insulator with a layer of an adhesion promoter;
   lining said adhesion promoter with a layer of a seed material;
   coupling a laser radiation to at least one of said lining layers; and
   using an LCVD process to fill said via with a solid metal.

2. The method of fabricating a high aspect ratio, solid-metal filled via, according to claim 1, wherein the aspect ratio of said vias from about 3:1 to about 10:1.

3. The method of fabricating a high aspect ratio, solid-metal filled via, according to claim 1, wherein said via opens to a major surface of said semiconductor substrate.

4. The method of fabricating a high aspect ratio, solid-metal filled via, according to claim 1, further comprising:
   lining said major surface with a stack comprising:
   a layer of an electrical insulator continuous with said insulator layer lining said via;
   a layer of an adhesion promoter continuous with said promoter layer lining said via; and
   a layer of a seed material continuous with said seed layer lining said via.

5. The method of fabricating a high aspect ratio, solid-metal filled via, according to claim 4, further comprising:
  polishing said via co-planar with said major surface by CMP.

6. The method of fabricating a high aspect ratio, solid-metal filled via, according to claim 5, further comprising:
  removing said adhesion layer and said seed layer from said major surface by CMP.

7. The method of fabricating a high aspect ratio, solid-metal filled via, according to claim 1, wherein said semiconductor substrate is selected from the group consisting of silicon, quartz, glass, and high temperature polymer.

8. The method of fabricating a high aspect ratio, solid-metal filled via, according to claim 1, wherein said insulator is selected from the group consisting of silicon nitride, silicon oxide, silicon oxynitride, and a $SiN/SiO_2$ stack.

9. The method of fabricating a high aspect ratio, solid-metal filled via, according to claim 1, wherein said adhesion promoter is selected from the group consisting of Ta, Cr, Ti, TaN, and TiN.

10. The method of fabricating a high aspect ratio, solid-metal filled via, according to claim 1, wherein said seed is selected from the group consisting of tungsten and molybdenum.

11. The method of fabricating a high aspect ratio, solid-metal filled via, according to claim 1, wherein said solid-metal filler is selected from the group consisting of tungsten, molybdenum, tantalum, and gold.

12. The method of fabricating a high aspect ratio, solid-metal filled via, according to claim 1, wherein filling with a solid metal comprises a thermally-activated chemical vapor deposition (CVD) process.

13. The method of fabricating a high aspect ratio, solid-metal filled via, according to claim 12, wherein said CVD comprises laser-assisted CVD (LCVD).

14. The method of fabricating a high aspect ratio, solid-metal filled via, according to claim 13, wherein said LCVD comprises a continuous-wave laser.

15. The method of fabricating a high aspect ratio, solid-metal filled via, according to claim 14, wherein
  said laser radiates at a wavelength that couples with the rod metal; and TiN, and wherein
  said laser does not couple to any of $SiO_2$, SiN, and Si.

16. The method of fabricating a high aspect ratio, solid-metal filled via, according to claim 13, wherein said laser couples with a material selected from the group consisting of said seed and said adhesion promoter.

17. The method of fabricating a high aspect ratio, solid-metal filled via, according to claim 16, wherein said LCVD further comprises:
  providing an ambient comprising at least one precursor gas and at least one reducing gas;
  forming a nucleation site for a growth of metal by forming a focus of said laser on said coupling material on said bottom of at least one of said vias;
  depositing metal at said nucleation site; and
  continuing to deposit metal at a growing rate.

18. The method of fabricating a high aspect ratio, solid-metal filled via, according to claim 17, wherein said precursor gas is selected from the group consisting of $WF_6$, $WCl_6$, $W(CO)_6$, $MoF_6$, $MoCl_6$, and $Mo(CO)_6$.

19. The method of fabricating a high aspect ratio, solid-metal filled via, according to claim 18, wherein a preferred precursor gas is $WF_6$.

20. The method of fabricating a high aspect ratio, solid-metal filled via, according to claim 17, wherein said reducing gas is selected from the group consisting of hydrogen and silane.

21. The method of fabricating a high aspect ratio, solid-metal filled via, according to claim 17, wherein said focus is formed by directing said laser through a lens.

22. The method of fabricating a high aspect ratio, solid-metal filled via, according to claim 17, further comprising;
  providing an array of vias;
  providing an array of lenses such that a focus is formed in each of said vias; and
  forming a metal rod in each of said vias.

23. The method of fabricating a high aspect ratio, solid-metal filled via, according to claim 22, further comprising:
  polishing said array of vias co-planar with said major surface by CMP.

24. The method of fabricating a high aspect ratio, solid-metal filled via, according to claim 17, further comprising;
  providing an array of vias;
  providing a mask having an array of voids defined therethrough, wherein said mask does not couple to said laser;
  irradiating said array of vias through said mask; and
  forming a metal rod in each of said vias.

25. The method of fabricating a high aspect ratio, solid-metal filled via, according to claim 24, wherein said mask is a holographic phase mask.

26. The method of fabricating a high aspect ratio, solid-metal filled via, according to claim 17, further comprising;
  providing an array of vias;
  providing a reaction chamber to contain said mount, said array of vias, and said ambient;
  providing a mask having an array of voids defined therethrough, wherein said mask is positioned outside said chamber;
  irradiating said array of vias through said mask; and
  forming a metal rod in each of said vias.

27. The method of fabricating a high aspect ratio, solid-metal filled via, according to claim 17, further comprising;
  providing an array of vias;
  providing a high pulse rate, laser microvia drill;
  irradiating said array of vias using said microvia drill; and
  forming a metal rod in each of said vias.

28. The method of fabricating a high aspect ratio, solid-metal filled via, according to claim 17, further comprising:
  forming an array of vias in said substrate;
  mounting said substrate in a reaction chamber having a laser-transparent window;
  forming a laser focus in each via of said array, thereby forming a nucleation site in each of said vias; and
  forming a rod by translating said mount in a direction parallel to the beam of said laser.

29. The method of fabricating a high aspect ratio, solid-metal filled via, according to claim 16, wherein said LCVD further comprises:
  mounting said substrate on a three-axis mount; and
  propagating the growth of a metal rod by moving said mount away from said focus at a rate substantially equal to said growing rate.

30. The method of fabricating a high aspect ratio, solid-metal filled via, according to claim 13, wherein said LCVD comprises a pulsed laser.

* * * * *